FET DYNAMIC DATA INVERTER

Filed March 15, 1968 2 Sheets-Sheet 1

INVENTOR
RICHARD B. RUBINSTEIN
BY James and Franklin
ATTORNEYS

FET DYNAMIC DATA INVERTER

Filed March 15, 1968 2 Sheets-Sheet 2

INVENTOR
RICHARD B. RUBINSTEIN
BY James and Franklin
ATTORNEYS

United States Patent Office 3,517,210 Patented June 23, 1970

3,517,210

FET DYNAMIC DATA INVERTER

Richard B. Rubinstein, New York, N.Y., assignor to General Instrument Corporation, Newark, N.J., a corporation of Delaware Filed Mar. 15, 1968, Ser. No. 713,390
Int. Cl. H03k 19/08
U.S. Cl. 307—205 22 Claims

ABSTRACT OF THE DISCLOSURE

An inverter for use in a logic system receives data signals from a prior logic stage. The effect at the inverter input of the production of unwanted feedthrough signals derived from one clock pulse at the prior logic stage is neutralized by coupling another phase of the clock pulse to the gate of the inverter. An attenuation is introduced at the inverter input to correct for possible overcompensation of the data input signals to the inverter as a result of the coupling of the neutralizing clock pulses thereto.

BACKGROUND OF THE INVENTION

The present invention relates to logic circuitry, and, in particular, to logic circuitry utilizing field effect transistors.

One of the more significant recent developments in semiconductor technology has been the development of the metal oxide field effect transistor (FET), or as it is also known, the insulated gate field effect transistor. In contrast to conventional semiconductor devices, the FET is a voltage controlled device rather than a current controlled device. At a negative level of voltage applied to the gate, the FET is in a conductive or "on" state and when a second more positive voltage is applied to the gate level (usually a reference potential such as ground), the FET is rendered non-conductive or in the "off" stage. Thus it will be seen that the FET operates as a voltage controlled switch which is suitable for use in switching and logic circuits of the type commonly utilized in digital computers.

One advantage of the use of FETs in logic circuitry is that the FET's can be readily incorporated into integrated circuit chips which enables improved miniaturization and a reduction in the power requirements of the logic system. The FETs, as well as the associated circuit elements, may all be incorporated into a single chip, as the individual chips are interconnected to complete the overall logic system.

A basic building block of presently employed logic systems is the data inverter which receives data input from a prior logic circuit and produces an output signal of an inverted polarity with respect to the data input. The inverted data signal is used as an input signal for a subsequent logic stage or stages which carry out predetermined logic operations. In order to synchronize the operation of the various stages of the logic system, synchronous clock pulses of predetermined frequency and phase relationship are applied to each stage of the logic system. It has been found highly advantageous in FET logic circuitry to employ four phase clock pulses, wherein the pulses are in predetermined phase relationship with one another. One possible circuit for developing four phase clock pulses of this type has been disclosed in copending patent application Ser. No. 567,954, now Pat. No. 3,448,295, entitled "Four Phase Clock Circuit," filed on July 26, 1966, in the name of Frank M. Wanless, and assigned to the assignee of the present application.

The inverter circuit receives certain of the clock pulse signals which are in predetermined phase relation with the clock pulse singals received by the logic circuits so that the output of the data inverter can be sampled in synchronism with the output of the logic circuits. In this manner, the data at the output of the first logic circuit is transferred to the data inverter and to the input sage of a second logic circuit. The inverted output of the data inverter is also transferred to the second logic circuit and may be sampled there at the same time interval as the output of the first logic circuit.

The presence of the inherent feedthrough capacitance between the gate and drain and the gate and source of the FET produces a problem in FET logic circuitry which is characterized by the unwanted feedthrough of signals corresponding to the clock pulses from one stage of the logic circuit to another. The feedthrough of a positive going clock pulse to a subsequent logic stage due to the capacitive feedthrough between the terminals of the first logic stage may cause the second logic stage FET to be turned off, thus providing an incorrect logic operation. It is also possible for a negative going clock pulse to feed through to the next logic stage due to the capacitive feedthrough, and it may be that this negative clock pulse feedthrough may cause the logic stage to erroneously be switched into the conductive stage. It has, however, been found that the latter problem is not as critical as the former. When the first FET is switched on by the negative going clock pulse, the amplitude of the clock pulse is limited as the negative clock pulse quickly decays. Thus, the present invention deals primarily with the problem of feedthrough of positive going clock pulses to a second logic stage which may have the undesirable effect of improperly turning the second stage into the "off" or nonconducting state.

It is, therefore, an object of the present invention to provide an improved logic circuit such as a data inverter utilizing FET's wherein the effect of the positive feedthrough of clock signals to the inverter is substantially neutralized.

It is a further object of the present invention to provide a logic circuit such as a data inverter wherein one phase of a multiphase clock pulse is employed to neutralize unwanted signals derived from the feedthrough of another phase of the clock signal.

It has been found that the provision of means for neutralizing the effects of clock pulse feedthrough may produce an excessive correction to the data signal, thereby causing the signal voltage level of the inverter input data signal to fall to a level below the voltage threshold of the inverter input FET so that incorrect logic operation may result.

It is therefore a further object of the present invention to prvoide a logic circuit such as a data inverter circuit wherein further means are provided for correcting for the overcompensating effects of the neutralizing clock pulse feedthrough.

To these ends, the present invention provides a data inverter circuit receiving a data signal as well as clock signals of predetermined frequency and phase relationship. To neutralize the undesired signals produced by the feedthrough of at least one phase of clock pulse through a semiconductor switching element of the prior logic stage to the inverter, means are provided for coupling another phase of the clock pulse to the inverter. The latter phase of the clock pulse neutralizes the signals derived from the positive feed-through effects of the other clock pulse phases. In a preferred embodiment of this invention, the coupling of the neutralizing clock pulse phase is accomplished through a capacitor having one of its terminals connected to a source of the correcting clock pulse phase. It has, however, been found that the provision of the neutralizing clock pulse tends to cause an overcompensating effect to the data signal at the inverter FET. To eliminate this overcompensating effect, a second capacitor is coupled between the gate of the inverter FET and ground or some other reference potential to provide attenuation to the neutralizing clock pulse. As a result of the arrangement of the present invention, logic signals corresponding to both the "0" and "1" level will be accurately coupled to the data inverter despite the presence of the unwanted signals caused by the feedthrough of the clock signals and the overcompensating effects produced by the means for neutralizing the effects of the feedthrough of these clock signals.

To the accomplishment of the above, and to such other objects as may hereafter appear, the present invention relates to a data inverter circuit as defined in the appended claims and as described in this specification, taken together with the accompanying drawings in which;

FIGS. *4a–4d* are pulse timing diagrams illustrating the effect of feedthrough neutralization and overcompensation correction as provided by the features of the present invention.

Figure 1:
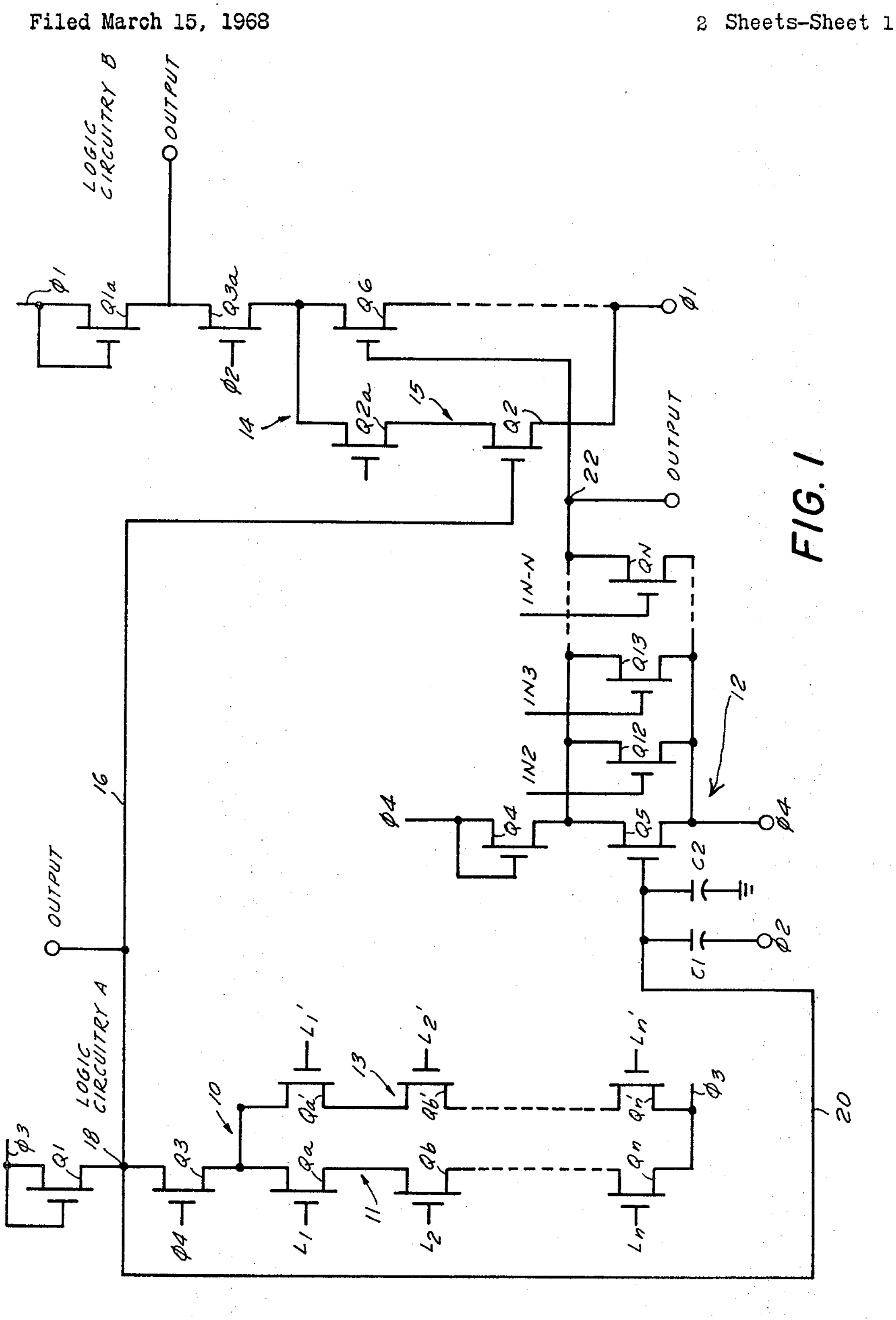
FIG. 1 is a schematic diagram of a typical logic system comprising the data inverter circuit of the present invention.

With reference now to the figures, FIG. 1 illustrates schematically a circuit diagram of a portion of a logic system which employs field effect transistors (FET) as the logical or switching devices. As a resulut of the great advances in semiconductor manufacturing techniques, it is now feasible to form a plurality of such FETs, along with the accompanying circuit element parameters, all of which may be incorporated on a single integrated circuit chip, thus resulting in a tremendous reduction in size requirements for computer logic stages.

As has been pointed out, the FET is a semiconductor device which differs from the more commonly known transistor in that it is voltage controlled rather than current controlled. Moreover, in contrast to the conventional transistor, the input impedance of the FET is of a relatively high magnitude. Briefly stated, the theory of operation of a FET involves the control of the current flow within a channel provided between the source and the drain. The current flow is controlled within the channel by the voltage applied to the gate of the FET. In the normal mode of operation the voltage connections of the FET are maintained such that the drain-substrate and the source-substrate junctions are reverse-biased. With the gate electrode at ground potential these reverse-biased junctions provide a relatively high impedance for any current flowing from the source to the drain. However, when the gate voltage is made sufficiently negative, the conductivity of a thin layer of semiconductor material adjacent to the surface lying beneath the gate region will be inverted. When this occurs the reverse-biased junctions, which impede the source-to-drain current flow, are bypassed by an induced channel formed in the semiconductor layer between the source and drain. Depending on the type of semiconductor material involved, the layer is described as being either of the enhancement or depletion type.

The logic stage illustrated schematically in FIG. 1 comprises a first logic circuit 10 having its output connected to a dynamic inverter 12 and also to the input of a second logic stage 14. Logic circuit 14 also receives the output signal from inverter 12. It will be understood that logic stages 10 and 14. in the illustrated embodiment, are both NAND/NOR circuits the operation of which is known to those having skill in the computer art and in themselves form no part of the present invention. Therefore the description of circuits 10 and 14 will be relatively brief.

Logic circuit 10 comprises a plurality of parallel arranged, series connected FETs, each series connected FET path forming a single NAND logic circuit. Thus, as in the illustrated embodiment, the first NAND circuit 11 comprises a plurality of FETs Q*a*, Q*b* . . . Q*n* arranged in a series circuit path, the adjacent drain and source junctions of each succeeding FET within this path being connected to one another. Input logic signals $L_1$, $L_2$ . . . L*n* are applied to the gates of Q*a*, Q*b* . . . Q*n*. A second NAND circuit 13, comprising FETs Q*a'*, Q*b'* . . . Q*n'* is connected in parallel to NAND circuit 11 and receives input data signals $L_1'$, $L_2'$ and L*n'* respectively. It will be understood that each of the parallel FET NAND circuits may comprise any number *n* of FETs corresponding to the number of input signals applied to each of the NAND circuits. Upon the proper application of the clock pulses, the presence of a negative going logic "1" signal at the input gate of each logic element of the FET of a particular NAND circuit path will produce a positive signal at the output terminal 18 of logic circuit 10. That is, if each of the signals applied to the gates of FETs Q*a*, Q*b* . . . Q*n* is negative then a positive signal will appear at the output of the NAND circuit 11 and at terminal 18, when a suitable phase of the clock pulse is present. When, any or all of the signals at the input of a NAND circuit are at ground, or logic "0" level, the NAND circuit will produce a negative output signal. In the presence of a logic "1" indication at the output terminal of any of the NAND circuits of the logic circuit 10, a corresponding logic signal will appear at output terminal 18 so that logic circuit 10 operates as a NAND/NOR circuit. The negative or inverted function of the input logic signals is derived by the inversion of the input signal logic level effected by each FET in the NAND circuits of logic circuit 10.

Similarly logic circuit 14 may comprise a plurality of parallel NAND circuits of which only two are shown in FIG. 1, arranged to produce a NAND/NOR logic operation. It will be noted that the output logic signal of logic circuit 10 is applied via conductor 16 to the input of FET $Q_2$, which along with FET $Q_2a$ provides a NAND circuit 15. The input logical signal to FET $Q_2a$ is applied from a logic signal source (not shown). The output data signal of logic circuit 10 is applied to the gate of the input FET $Q_5$ of the data inverter 12 which signal is then inverted by the operation of data inverter 12 and subsequently applied to a FET $Q_6$ arranged in parallel with NAND circuit 15 of logic circuit 14.

Figure 2:
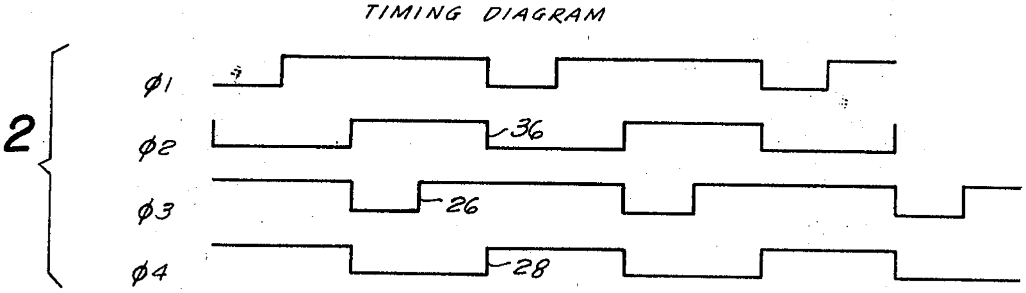
FIG. 2 is a pulse timing diagram illustrating the phase relationship between the four clock phases utilized in the operation of the system of FIG. 1.

It has been found greatly desirable to utilize what has been referred to as four-phase logic in the operation of FET logic circuitry. In this type of circuit a series of four clock pulses each of the same frequency, but phase displaced from one another by a predetermined amount, is applied to the various stages of the logic system. By the proper phase displacement and application of the respective clock pulses to the various stages of the logic system, synchronous sampling may be accomplished in the respective stages of the logic system. A circuit for deriving four phase clock signals or pulses has been described in the aforementioned Wanlass patent application Ser. No. 567,974. A typical pulse timing diagram for use in a four phase logic system is illustrated in FIG. 2 wherein the four phase clock pulses are designated $\phi_1$, $\phi_2$, $\phi_3$, and $\phi_4$. It will be noted that the frequency of each clock pulse is the same and may conveniently be as high as 5 mega-Hertz, but that each of the clock pulses has its own individual phase characteristic. For purpose of reference in the logic system embodied in FIG. 1, the maximum positive value of each of the clock pulses corresponds substantially to ground, while the maximum negative excursion of each of the clock pulses corresponds to approximately minus 24 volts.

Clock pulse $\phi_3$ is simultaneously applied to the drain and gate of FET $Q_1$ and to each NAND circuit path of logic circuit 10. The source of $Q_1$ and the drain of FET $Q_3$ are in connection with the output terminal 18 of logic circuit 10. They are also connected via conductor 16 to the gate of FET $Q_2$ of logic circuit 14. FET $Q_2$ will become unconditionally precharged in the negative direction at the period at which clock pulse $\phi_3$ is negative. Clock pulse $\phi_4$ is applied to the gate of FET $Q_3$ and as a result the input data signals $L_1, L_2 \ldots Ln$ of logic circuit 10 are sampled at the period at which clock pulse $\phi_3$ returns to ground potential and clock pulse $\phi_4$ becomes negative. Thus, when input data signals $L_1, L_2 \ldots Ln$ are all negative at the sampling time the output of NAND circuit 11 and thus of logic circuit 10 appearing at terminal 18 will be at ground or at zero volts as the operation of the NAND circuit 11 is to produce the inversion of the input signal.

The operation of logic circuit 14 is substantially the same as that of logic circuit 10 with the sampling interval being determined by the clock pulses $\phi_1$ and $\phi_2$ applied to FETs $Q_1a$ and $Q_3a$ respectively. Clock pulse $\phi_1$ is also applied to each NAND circuit of logic circuit 14. Sampling will occur when $\phi_1$ is positive and when $\phi_2$ is negative. From an examination of the pulse timing diagram of FIG. 2 it will be seen that the sampling of logic circuit 10 will occur at a different time than the sampling of logic circuit 14.

Output terminal 18 of logic circuit 10 is connected via conductor 20 to the gate of FET $Q_5$ of the data inverter 12. It will be noted that inputs from other logic circuits (not shown) designated as $IN_2$, $IN_3$ and $IN_n$ may be applied to other FET's such as $Q_{12}$, $Q_{13}$, and QN respectively in inverter 12 so that the inverter circuit will operate as a multiple input NOR circuit. The data inverter stage, which once again inverts the output data signal of logic circuit 10, operates in the following manner.

The clock pulse $\phi_3$ applied to FET $Q_1$ serves to negatively precharge the input capacitance of the gate of FET $Q_5$ during the negative portion of clock pulse $\phi_3$. In FET $Q_4$, as in FETs $Q_1$ and $Q_1a$, the gates are connected to the drains in a self-biasing arrangement to result in an effective two-terminal or diode configuration having a non-linear resistance characteristic. These arrangements respectively provide a semiconductor current limiting load for FETs $Q_5$, $Q_3$ and $Q_3a$ respectively. Clock pulse $\phi_4$ is applied to the source and gate of FET $Q_4$ of inverter 12 and to the source of FET $Q_5$ of inverter 12 so that at the period of time at which $\phi_4$ is negative and $\phi_3$ has returned to ground level, a data transfer may be made from logic circuit 10 to the input of data inverter 12 of logic "1" or zero volts signal. The input capacitance of FET $Q_5$ will be charged by the logic "1" signal from a negative voltage to substantially ground or zero volts. If a logic "1" is not present at the output terminal 18 of logic circuit 10 then the gate of FET $Q_5$ will remain negative. During the time intervals that clock pulse $\phi_4$ is negative, FET $Q_4$ will precharge the input capacitance of FET $Q_6$ of logic circuit 14. At the instant that $\phi_4$ goes positive (i.e. to ground), FET $Q_4$ will be cut off and FET $Q_5$ will be placed in the "on" or conductive condition if a logic "0" (negative voltage) is present from the output of logic circuit 10 at the gate of FET $Q_5$. Thus, the output terminal 22 of the data inverter 12 will represent the inverted signal present at the gate of FET $Q_5$ and will approach the logic "1" level after $\phi_4$ has gone positive, and will reach the steady state value of ground or zero volts.

Thus, it will be seen that the provisions of the four phase logic pulses applied to the various logic stages of the overall logic system permits the synchronous sampling of the data signals obtained from logic circuit 10 and the inverted data signal produced by the inverter 12 available at terminal 22 and applied to logic circuit 14. In the event that data from logic circuit 10 is to be coupled to a third logic circuit, the provision of the phase synchronized clock pulses will provide for a similar synchronous sampling operation of both the data and inverted data signals.

What has been described above is a known four phase logic system incorporating a data inverter between various logic circuits of the system to provide a negative or inverted data signal wherein means are provided for synchronously sampling the data signals. It has, however, been found that due to the inherent feedthrough capacitance between the gate and drain and between the gate and source of the FET's an unwanted feedthrough of clock pulses between the various logic stages, and between the logic circuit and the data inverter occur. Thus, in the circuit of FIG. 1, the clock pulse $\phi_3$ will feed-through between the gate and drain of $Q_1$ due to the feed-through capacitance of FET $Q_1$, and the clock pulse $\phi_4$ will feed-through the gate and drain of FET $Q_3$. The feed-through portions of clock pulses $\phi_3$ and $\phi_4$ will therefore provide unwanted additional signals which will appear at the output terminal 18 of logic circuit 10, and will be unavoidably coupled to the gate of FET $Q_5$ of the data inverter 12.

Figure 3:
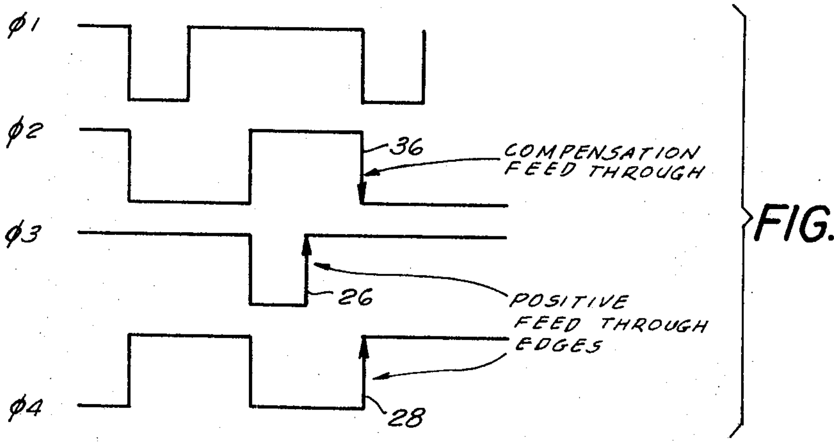
FIG. 3 is a detailed portion of the pulse timing diagram of FIG. 2.

The possible deleterious effects of the additional signals derived from the feedthrough of clock pulses $\phi_3$ and $\phi_4$, to the gate of the data inverter 12 and the manner by which the present invention effectively corrects for this feedthrough, will now be described with particular attention being given to FIG. 1 and to the pulse diagrams of FIGS. 3 and 4. The problem of feedthrough of the clock pulses to the input of FET $Q_5$ is most serious in the case wherein a negative signal (logic "0") is to be transferred from logic circuit 10 to the gate of FET $Q_5$. This situation is illustrated best in FIG. 4*a*. A logic "0" signal will establish a minus voltage at the gate of FET $Q_5$ as indicated at 25. The unwanted signal derived from the feed-through of the positive going edge 26 (FIG. 3) of clock pulse $Q_3$ applied to the gate of FET $Q_5$ raises the signal level at the gate of FET $Q_5$ by an amount substantially equal to the magnitude of the feedthrough signal as shown at 27. The positive feed-through of a positive going edge 28 of clock pulse $\phi_4$ produces an additional unwanted signal at the gate of FET $Q_5$ which introduces an additional positive increment at the level present at the gate of FET $Q_5$ as shown at 29. It is seen that the level of the signal at level 29 is dangerously close to the ground level at which FET $Q_5$ will be erroneously turned into the off or non-conducting condition. In other words, the unwanted feedthrough signals derived from the feedthrough of the positive going portions of the clock pulses $\phi_3$ and $\phi_4$ through FET's $Q_1$ and $Q_3$ respectively, and present at the gate of FET $Q_5$, cause the overall signal level at the gate of FET $Q_5$ to approach the threshold or ground voltage level at which the switching state of FET $Q_5$ will be erroneously changed. This will result in an incorrect logic level at the sampling time of FET $Q_5$, that is when clock pulse $\phi_4$ becomes positive.

In accordance with a significant aspect of the present invention a capacitor $C_1$ (FIG. 1) is connected between the gate of FET $Q_5$ and the source of clock pulse $\phi_2$, to neutralize the effect of the feedthrough of the signals derived as a result of the feedthrough of clock pulses $\phi_3$ and $\phi_4$ for reasons which shall become readily apparent. Referring to either FIG. 2 or FIG. 3, it is seen that clock pulse $\phi_2$ goes negative at the time that clock pulse $\phi_4$ goes positive, the two clock pulses being substantially 180° out of phase with respect to one another. Thus, the addition of the negative going pulse 36 of $\phi_2$ clock pulse (FIG. 3) through capacitor $C_1$ to the gate of FET $Q_5$ at the time that the positive going edge 28 of clock pulse $\phi_4$ is present, will neutralize or cancel out the effects of the feedthrough signal derived from the feedthrough of the positive edge of clock pulse $\phi_4$. This is shown clearly in FIG. 4*b* wherein the increment represented by 27 due to the feedthrough of clock pulse $\phi_3$ is still present. Increment 27 is of such insufficient magnitude as not to present any possibility that FET $Q_5$ will be incorrectly switched into the non-conductive stage. However, introduction of clock pulse $\phi_2$ through capacitor $C_1$ at the gate of FET $Q_5$ prevents the further increase in signal level as at 28 by neutralizing the effect of the signals derived from the feed-through of clock pulse $\phi_4$, and thereby causes the signal level thereat to return to its negative level as shown at 30, at the time that clock pulse $\phi_2$ goes negative.

As a result of the introduction of the neutralizing clock phase $\phi_2$ through capacitor $C_1$, the data signal of the input of inverter 12, is thus at substantially the correct negative level corresponding to a true logic "0" data signal.

Figure 4A:
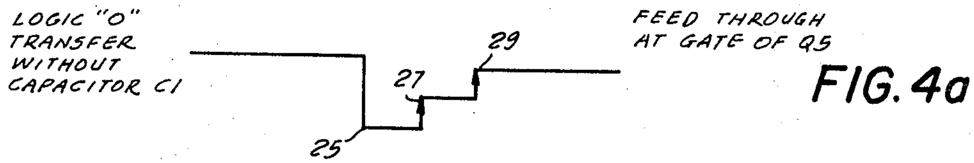
Figure 4B:
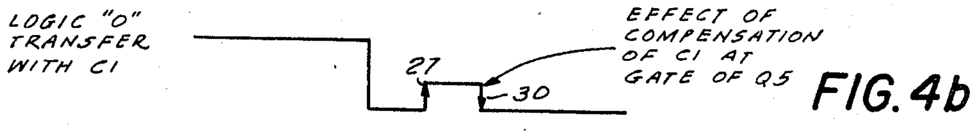
Figure 4C:
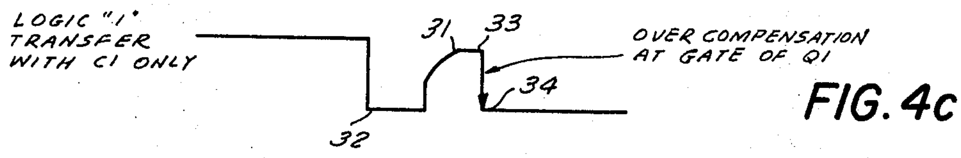

In the event that a logic "1" signal or a ground signal is being transferred from logic circuit 10 to the data inverter 12, the introduction of clock pulse $\phi_2$ to the gate of FET $Q_5$ through the capacitor $C_1$ will present another problem, as illustrated in FIG. 4*c*. When a logic "1" or ground signal is present at the output of terminal 18 and conducted to the gate of FET $Q_5$, the logic "1" signal is represented by a pulse 31 which rises from the negative level 32 through a predetermined rise time at the sampling period until it reaches the ground or zero level as shown at 33. However, the presence of the compensating or neutralizing clock pulse $\phi_2$ applied at the gate of FET $Q_5$, causes the logic "1" signal to go negative as shown at 34 to a level which will place FET $Q_5$ erroneously into an on or conducting state. Thus the neutralizing effect of introducing clock pulse $\phi_2$ through the capacitor $C_1$, which provides for correction for a logic "0" signal, may, if uncorrected, cause an overcompensation at logic "1" signals which in turn will produce an erroneous logic indication at the output of inverter 12. Furthermore, for a logic "1" signal there will be no feed-through of the positive edge 28 of clock pulse $\phi_4$ since the P region of the driving stage of the output of the logic circuit at ground or zero volts will clamp the positive going edge of $\phi_4$. The P region of the driving stage comprises the source of FET $Q_1$ and the drain of FET $Q_3$. In the fabrication of the integrated circuit chip which contains the circuit elements of the logic system of FIG. 1 this P region is physically connected to the high impedance input gate of inverter 12.

During the sampling period, that is, the interval at which clock pulse $\phi_3$ is at ground and clock pulse $\phi_4$ is negative, the driving stage P region is at ground due to the ground level of clock pulse $\phi_3$. When the positive edge 28 of clock pulse $\phi_4$ is introduced therein, the P region acts as a forward biased clamping diode and clamps the voltage level in the P region at ground level.

To correct for this overcompensation at a logic "1" signal, a second capacitor $C_2$ is connected between the gate of FET $Q_5$ and ground. While it is difficult in FET oxide deposited technology to determine values of capacitance, the value of capacitor $C_2$ is approximately eight times greater than that of capacitor $C_1$. Capacitors $C_1$ and $C_2$ are preferably formed on the circuit chip in a known manner.

The provision of the impedance introduced by the capacitance $C_2$ provides a path to ground for a substantial portion of the neutralizing clock pulse $\phi_2$ introduced through capacitor $C_1$. In a typical system the magnitude of the feed-through pulses derived from clock pulses $\phi_3$ and $\phi_4$ is approximately three volts while the clock pulses vary from ground potential to a negative signal of approximately minus 24 volts. Thus only a relatively small portion of neutralizing clock pulse $\phi_2$ need be introduced to neutralize the positive feed-through effects of clock pulses $\phi_3$ and $\phi_4$. Therefore, the bypassing of a substantial portion of neutralizing clock pulse $\phi_2$ through capacitor $C_2$, which is necessary to prevent overcompensation of logic "1" signals, does not deleteriously affect the neutralizing clock pulse $\phi_2$ upon a logic "0" signal.

Figure 4D:
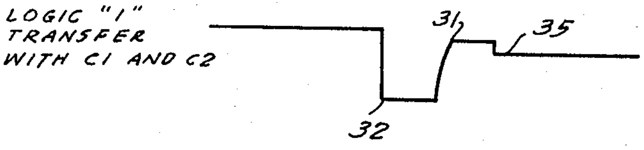

The improved results obtained by the provision of capacitor $C_2$ between the gate of FET $Q_5$ and ground are illustrated in FIG. 4*d* wherein the logic "1" pulse is represented by 31, as in FIG. 4*c*. The introduction of neutralizing clock pulse $\phi_2$ tends to decrease the level of the logic "1" pulse, as shown at 35, but this reduction in signal level is kept to a harmless minimum due to the bypassing to ground of most of clock pulse $\phi_2$ through capacitor $C_2$.

Thus in accordance with the improved circuit arrangement of the data inverter circuit 12, logic "0" level transfers to the gate of FET $Q_5$ of the inverter stage 12 will not be affected by positive feed-through effects of the clock pulses from the prior logic stage, and the logic "1" transfers will not receive any adverse effects due to the overcompensation produced by the introduction of the logic "0" neutralizing clock pulse. As a result of the relatively simple expedient of introducing one of the already existing clock pulses utilized in the four phase logic system as a neutralizing clock pulse, the effects of the unavoidable feedthrough of others of the clock pulses to the inverter are reliably corrected with available system components, false turn-on and turn-off of logical operations of the data inverter being effectively prevented. Furthermore this has been achieved by use of a minimal alteration to the integrated circuits incorporating all of the conventional logic elements and without the need for additional neutralizing signals.

While only a single embodiment of the present invention has been disclosed and described herein, it will be apparent to those skilled in the art that many variations may be made thereto without departing from the spirit and scope of the present invention as defined in the following claims.

I claim:

1. A switching circuit for receiving a data signal from a logic circuit or the like to establish said switching circuit in either a first or a second switching condition, said logic circuit having first clock pulses applied thereto and having an output terminal at which said data signals and additional signals derived from said first clock pulses are present, said switching circuit comprising semiconductor switching means having an input terminal, means for connecting said input terminal to said logic circuit output terminal, thereby to transfer to said input terminal said data signal and said additional signals from said logic circuit, and means operatively connected to said input terminal for applying thereto second clock pulses having a component in opposition to said additional signals, thereby to at least partially neutralize said additional signals, and render said switching means more reliably responsive to said data signal.

2. A switching circuit as claimed in claim 1 wherein said semiconductor switching means is a field effect transistor, said input terminal being a gate terminal.

3. A switching circuit as claimed in claim 2 wherein said applying means comprises a capacitor connected between said gate terminal and a source of said second clock pulses.

4. A switching circuit as claimed in claim 3 further comprising means for limiting the magnitude of said second clock pulses applied to said gate terminal.

5. A switching circuit as claimed in claim 4 wherein said limiting means comprises a second capacitor connected between a reference potential and said gate terminal.

6. A switching circuit as claimed in claim 2 wherein said logic circuit comprises a field effect transistor having feedthrough capacitance between the terminals thereof, pulses derived from said first clock pulses being transferred to said gate terminal as a result of said feedthrough capacitance thereby to constitute said additional signals.

7. A switching circuit as claimed in claim 6 wherein said second clock pulses are of an opposing polarity to the polarity of said additional signals.

8. A switching circuit as claimed in claim 7 wherein a third signal derived from third clock pulses having components thereof in phase alignment with said second clock pulses, so as not to be neutralized thereby, is applied to said gate terminal, said third signal being of an opposite polarity to said data signal but of a magnitude insufficient to erroneously affect the condition of said switching circuit as established by said data signal.

9. A switching circuit as claimed in claim 1 further comprising means for preventing overcompensation of said additional signals by said second clock pulses.

10. A switching circuit as claimed in claim 9 wherein said overcompensation preventing means comprises means for attenuating said second pulses.

11. A switching circuit as claimed in claim 10 wherein said attenuating means comprises a capacitor connected between a reference potential and said input terminal.

12. A switching circuit as claimed in claim 6 further comprising means for preventing overcompensation of said additional signals by said second clock pulses.

13. A switching circuit as claimed in claim 12 wherein said overcompensation preventing means comprises means for attenuating said second clock pulses.

14. A switching circuit as claimed in claim 3 wherein said attenuating means comprises a capacitor connected between a reference potential and said gate terminal.

15. A switching circuit as claimed in claim 1 wherein said applying means comprises capacitive means connected between said input terminal and a source of said second clock pulses.

16. In a four phase logic system comprising a logic circuit providing an output data signal, a data inverter operatively connected to said logic circuit for receiving and inverting said data signal, means for applying selected ones of four phase displaced clock pulses to said logic circuit and said inverter, said logic circuit comprising semi-conductor switching means having feedthrough characteristics between the terminals thereof such that additional signals derived from at least one of said clock pulses is coupled to said inverter as a result of said feedthrough characteristics; the improvement comprising means for applying to said inverter circuit another of said clock pulses of a preselected phase displacement from said at least one of said clock pulses, thereby to at least partially neutralize the effect of said additional signals coupled to said inverter.

17. The improvement as claimed in claim 16 wherein said semi-conductor switching means is a field effect transistor having a gate, a drain and a source and said feedthrough characteristics comprise feedthrough capacitance between said gate and said source, and between said gate and said drain.

18. The improvement as claimed in claim 16 wherein said data inverter comprises an input field effect transistor having an input gate, said applying means comprising capacitive means operatively connected to said input gate.

19. The improvement as claimed in claim 16 further comprising means for preventing overcompensation of said additional signals by said applied clock pulses.

20. The improvement as claimed in claim 19 wherein said preventing means comprises means for attenuating said applied clock pulses.

21. The improvement as claimed in claim 20 wherein said attenuating means comprises means for establishing an impedance division between the input of said inverter circuit and a reference potential.

22. The improvement as claimed in claim 21 wherein said impedance division establishing means comprises a capacitor connected between the input of said inverter circuit and said reference potential.

References Cited

UNITED STATES PATENTS

| | | | |
|---|---|---|---|
| 3,322,974 | 5/1967 | Ahrons et al. | 307—304 XR |
| 3,393,325 | 7/1968 | Borror et al. | 307—251 XR |
| 3,395,292 | 7/1968 | Bogert | 307—221 |

STANLEY T. KRAWCZEWICZ, Primary Examiner

U.S. Cl. X.R.

307—208, 238, 246, 251, 304